United States Patent [19]

Hayashi et al.

[11] Patent Number: 5,371,385
[45] Date of Patent: Dec. 6, 1994

[54] SURGE PROTECTION DEVICE

[75] Inventors: Yutaka Hayashi, Tsukuba; Masaaki Sato, Machida; Yoshiki Maeyashiki, Chofu, all of Japan

[73] Assignees: Agency of Industrial Science & Technology, Ministry of International Trade & Industry; Sankosha Corporation; Ome Cosmos Electric Co., Ltd., all of Tokyo, Japan

[21] Appl. No.: 214,025

[22] Filed: Mar. 15, 1994

Related U.S. Application Data

[63] Continuation of Ser. No. 799,075, Nov. 27, 1991, abandoned.

[30] Foreign Application Priority Data

Nov. 29, 1990 [JP] Japan ................. 2-325431

[51] Int. Cl.$^5$ ............. H01L 29/74; H01L 29/90; H01L 29/48
[52] U.S. Cl. ................. 257/173; 257/110; 257/164; 257/167; 257/603
[58] Field of Search ............. 257/110, 164, 167, 173, 257/603

[56] References Cited

U.S. PATENT DOCUMENTS 4,063,277 12/1977 Gooen ........................... 357/38
5,083,185 1/1992 Hayashi et al. ................. 357/38

FOREIGN PATENT DOCUMENTS 0259501 11/1986 Japan ........................ 257/164

*Primary Examiner*—Robert Limanek
*Assistant Examiner*—David B. Hardy
*Attorney, Agent, or Firm*—Oblon, Spivak, McClelland, Maier & Neustadt

[57] ABSTRACT

A vertical type surge protection device for absorbing surges of either polarity has a second region forming a first pn junction with a first region, a third region forming a first minority carrier injection junction with respect to the second region, a fourth region forming a second pn junction with the first region and a fifth region forming a second minority carrier injection junction with the fourth region. When the absolute value of a surge voltage applied across the device exceeds the breakdown voltage, either the one of the first and second pn junctions that is reverse biased owing to the surge polarity breaks down or punch-through occurs between the first and third regions or between the first and fifth regions, whereafter breakover ensues as a result of positive feedback. For preventing breakover from being caused by noise having a dV/dt value not greater than a prescribed value, the short-side direction length of the third and fifth regions, in the case they are rectangular, or the diameter thereof, in the case they are circular, is determined on the basis of the prescribed dV/dt value.

11 Claims, 6 Drawing Sheets

SURGE PROTECTION DEVICE

This application is a continuation of application Ser. No. 07/799,075, filed on Nov. 27, 1991, now abandoned.

BACKGROUND OF THE INVENTION

1. Field of the Invention

This invention relates to a surge protection device for protecting electric and electronic circuits from abnormally high voltages and currents caused by, for example, lightning, switching surges or the like.

2. Description of the Prior Art

A wide range of devices referred to as surge protection devices have been devised. Even the number of such devices that fall in the category of two-terminal surge protectors is considerable. The better of these are not limited to the function of clamping the voltage across the device terminals at a fixed breakdown voltage at the time of breakdown caused by occurrence of a surge (i.e. do not function simply as constant-voltage diodes). Instead they further exhibit negative characteristics when the device current that begins to flow at the time of the device breakdown increases to above the breakover current value. As a result, the voltage across the terminals after breakdown is shifted to a clamp voltage that is lower than the breakdown voltage. It therefore becomes possible to absorb large currents.

Among the surge protection devices of this type some utilize an avalanche or Zener breakdown mechanism, while others use the punch-through breakdown mechanism. The present inventor previously developed a number of improvements in the punch-through type surge protection device. These are described in detail in Japanese Patent Application Public Disclosure Nos. Sho 61-237374, 61-259501, 62-65383 and 62-54776 and Japanese Patent Application Publication No. Hei 1-33951.

FIG. 7 shows an example of the sectional structure of a surge protection device 10 according to the prior art.

The surge protection device, designated by reference numeral 10, has a first semiconductor region 1 which is of either p or n conductivity type (n in the illustrated example) and is capable of serving as a semiconductor substrate. A second semiconductor region 2 and a third semiconductor region 3 are successively formed on one principal surface of the semiconductor region 1 by double diffusion. A fourth semiconductor region 4 is further formed on the other principal surface of the semiconductor region 1 as opposed to the second semiconductor region 2.

In the following explanation, the surface formed with the second semiconductor region 2 and third semiconductor region 3 will be referred to as the "front surface" and the surface opposite thereto as the "back surface". Moreover, the various semiconductor regions will be referred to simply as "regions."

Structurally speaking the surge protection device 10 shown in FIG. 7 is formed with the regions 1, 2, 3 and 4 stacked vertically in the thickness direction of the region 1. Moreover, as will be clear from the explanation of the device's operation given later, the device current resulting from surge absorption flows mainly in the thickness direction of the first region, between the third and fourth regions. The device can therefore be said to be of the vertical type. In contrast, there are also prior art surge protection devices of the lateral type in which the fourth region 4 is situated on the front surface at a position offset laterally from the second and third regions 2, 3 and the device current during operation also flows laterally. The present invention however relates only to an improvement in the vertical type.

The second region 2 and fourth region 4 have to be of opposite conductivity type from the first region 1 so that each makes a pn junction therewith. Therefore, as shown in the figures, in the case where the first region 1 is of n conductivity type, the second region 2 and the fourth region 4 are of P conductivity type. In the case where punch-through is utilized as the initial breakdown phenomenon in the manner to explained later, however, it is preferable to constitute the second region 2 to be of somewhat low concentration p conductivity type, namely to be of $p^-$ type.

On the other hand, the third region 3 and the first region 1 have to be of the same conductivity type as each other and of opposite polarity type from the second region 2 so as to form carrier injection junctions for injecting minority carriers into the second region. Since, as will be explained later, the third region 3 constitutes one end of the main device current path after breakdown, it preferably has high conductivity (i.e. is preferably of $n^+$ type).

At the surface of the fourth region 4 and the surface region 11 of the region 1 to the side of the fourth region 4 is provided a first device terminal $T_1$ (the lower side terminal in the figure) which is in ohmic contact with both of the regions 4 and 11. In addition, a second device terminal $T_2$ is provided in ohmic contact with the surfaces of the second region 2 and the third region 3.

For explaining the most basic operation of the illustrated surge protection device 10 during surge absorption it will first be assumed that the device terminal $T_1$ is in ohmic contact only with the surface of the fourth region 4.

When a surge voltage arises across the first and second device terminals $T_1$, $T_2$ at a relatively large magnitude and in such phase as to apply a reverse bias across the pn junction between the first region 1 and the second region 2, the depletion layer produced at the pn junction between the first and second regions by the application of the reverse bias grows not only inwardly into the first region 1 but also toward the third region 3. When the upper extremity of this depletion layer reaches the third region 3, a punch-through state is established between the first region 1 and the third region 3.

When this happens, minority carriers (from the viewpoint of the first region 1) are injected into the first region 1 from the fourth region 4. Since the injected minority carriers collect in the second region 2, device current begins to flow. The voltage at which this punch-through operation starts is designated as breakdown voltage $V_{BR}$ in the operating characteristics of these surge protection devices shown in FIG. 8. On the other hand, even if the second region 2 and the third region 3 should be shorted at their surfaces by mutual connection with the second device terminal $T_2$, once the device current begins to flow via the second region 2, as indicated in FIG. 8 by the portion of the characteristic curve designated as a, where the curve rises rapidly in the direction on the current axis, and rises to the point that the product between itself and the resistance along the path thereof in the second region 2 becomes equal to the forward voltage at the pn junction formed between the second region 2 and the third region 3, the pn junction turns on so that minority carriers (from the viewpoint of the second region 2) are injected from the third region 3 into the second region. This injection of minority carriers into the second region 2 causes the device current flowing between the first and second device terminals $T_1$, $T_2$ to become even larger. Since this in turn promotes the injection of minority carriers from the fourth region 4 into the first region 1, a positive feedback is obtained.

Thus, as can be seen from the voltage vs current characteristic curve in FIG. 8, when the current flowing between the first and second device terminals $T_1$, $T_2$ becomes greater than the value indicated as the breakover current $I_{BO}$, the positive feedback within the device clearly manifests itself in the form of the negative resistance characteristic segment b of the characteristic curve. As a result, the voltage across the first and second terminals $T_1$, $T_2$ shifts to a clamp voltage (or ON voltage) that is lower than the breakover voltage $V_{BO}$ at which breakover commenced and also lower than the breakdown voltage $V_{BR}$ at which punch-through first started. Therefore, as shown by the segment of the characteristic curve marked c, the device is able to absorb large surge currents while holding down the amount of heat it generates.

The maximum current which the surge protection device 10 can absorb across its first and second terminals $T_1$, $T_2$ is generally referred to as its "surge absorption capacity" $I_{pp}$. On the other hand, the minimum device current capable of maintaining the device in its on state after it has once turned on is called its "hold current" $I_H$. Differently from the breakover type surge protection device, in the case of, for example, the simple constant-voltage diode type surge protection device, the voltage across the terminals does not fall even after breakdown but, to the contrary, tends to rise gradually with increasing current absorption. Because of this, the device power consumption, i.e. the voltage across the terminals multiplied by the device current, and in consequence the amount of heat generated by the device become considerably large. The superiority of breakover type devices is obvious from this alone.

While the basic operation is as described above, the following additional function is realized as a result of the fact that the first device terminal $T_1$ is in ohmic contact with not only the surface of the fourth region 4 but also the surface region 11 of the region 1 located to the side of the fourth region 4.

As explained earlier, in the surge protection device shown in FIG. 7, the first region 1 and the second region 2 form a pn junction that is reverse biased during occurrence of a surge. A capacitance $C_j$ can therefore be assumed to be present at this junction.

Presuming that the first terminal $T_1$ is not in contact with the first region 1, the occurrence of a surge with a through-rate of dV/dt across the first and second device terminals $T_1$, $T_2$ would lead to the flow of a displacement current $i_t$ as expressed by Eq. 1 for charging the junction capacitance $C_j$.

$$i_t = (dV/dt)C_j \qquad (1)$$

When the areas of the respective regions are increased for obtaining a large surge absorption capacity, the junction capacity $C_j$ also generally becomes large, a value of, say, 100 pF or larger not being unusual. On the other hand, extensive in-depth studies and research conducted up to now have provided detailed information about the characteristics and behavior of surges. It is thus known that a lightning-induced surge on a telephone line, for example, may well result in a through-rate (dV/dt) of as high as around 100 V$\mu$s even in cases where the peak induced noise voltage in the circuit is low.

By substituting this value into Eq. 1, it is clear that the value $i_t$ of the displacement current for charging the junction capacitance may reach around 10 mA. Moreover, since it increases in proportion to the through-rate, it can be seen that the displacement current $i_t$ can reach quite a high instantaneous value.

Thus the device breaks over under a surge whose peak voltage does not reach the breakover voltage $V_{BO}$ prescribed by the device design, namely under a noise that would not ordinarily need to be absorbed, simply because the noise happened to be a particularly sharp one with a very high dV/dt. (Such a surge will hereinafter be referred to as a "small surge.") What this means in terms of the characteristic curve of FIG. 8 is that the effective breakover voltage $V_{BO}$ at the time such a misoperation occurs is shifted to a smaller value than that indicated by the curve.

In contrast to the foregoing, when the first device terminal $T_1$ is also in ohmic contact with the surface region 11 of the region 1 near the fourth region 4, a surge of a polarity which reverse biases the first region 1 and the second region 2 is applied. Therefore, the junction between the first region 1 and the fourth region 4 is forward biased. In this state, in the early phase of the surge voltage rise before the forward biased junction turns on, majority carriers (from the viewpoint of the first region 1) are injected into the first region 1 from the terminal $T_1$ side. As a result, the junction capacitance $C_j$ of the pn junction formed between the first region 1 and the second region 2 is rapidly charged. This technique has in fact been employed for realizing a surge protection device which does not respond to small surges. Moreover, the initial injection of majority carriers into the first region 1 for charging the junction capacitance proceeds without adversely affecting the aforesaid basic operation occurring after the start of breakdown. The reason for this is that when the increase in the majority carrier current following punch-through of the first region 1 and the third region 3 causes the voltage drop on the majority carrier current path along the fourth region 4 in the first region to become equal to the forward voltage across the junction between the fourth region 4 and the first region 1, minority carriers (from the viewpoint of the first region 1) begin to flow into the first region 1 from the fourth region 4 so that, from this time on, the device makes the transition from breakdown to breakover in accordance with the mechanism described earlier.

While the foregoing explanation was made with respect to a conventional punch-through type device, the inventor has also found that by increasing the thickness of the second region 2 and, in addition, appropriately selecting the geometric, impurity concentration and other parameters of the respective regions, it is possible to fabricate a surge protection device which uses avalanche breakdown or Zener breakdown as the initial breakdown mechanism for realizing a turn-on operating mechanism which is similar to that of the aforesaid punch-through type device as far as breakover is concerned.

As will be understood from the foregoing, the provision of the device terminal $T_1$ in ohmic contact with not only the fourth region 4 but also the surface of the first region 1 has enabled conventional surge protection devices to achieve a certain degree of freedom from misoperation under exposure to small surges. The problem is, however, that a surge protection device 10 fabricated in this manner is unable to provide an adequately large reverse withstand voltage. This is because the first region 1 is in direct contact with the device terminal $T_1$ via the ohmic contact portion 11 in a state where the first region 1 and the second region 2 are in a forward biased relationship and, therefore, the device terminals $T_1$, $T_2$ are in essence simply connected through a forward biased diode. The reverse direction characteristics of the device are therefore as indicated by the curve d in FIG. 8.

The conventional technology is therefore incapable of enabling fabrication of a surge protection device that is able to absorb surge irrespective of whether the positive surge polarity appears on the first device terminal $T_1$ or on the second device terminal $T_2$. If the first terminal $T_1$ should not have the portion 11 in ohmic contact with the first region 1, it would be possible to absorb surge of either polarity by forming the fourth region 4 in the same manner as the second region 2 and forming a fifth region in the fourth region 4 in the same manner as the third region 3 is formed in the second region 2. In this case, at the occurrence of a reverse polarity surge (i.e. a surge of the polarity causing the second device terminal $T_2$ to become positive), the pn junction at which punch-through (or avalanche or Zener breakdown) occurs would be the second pn junction formed by the first region 1 and the fourth region 4 and the function previously played by the third region 3 would be taken over by the fifth region. The negative characteristics obtained with this arrangement would thus enable absorption of reverse polarity surges.

If, however, a second device terminal $T_2$ should be provided in ohmic contact with both the surface of the second region 2 and the surface of the first region 1 for charging the junction capacitance of the second pn junction between the fourth region 4 and the first region 1, just as the first device terminal $T_1$ was provided in ohmic contact with both the surface of the fourth region 4 and the surface of the first region 1 for charging the junction capacity of the first pn junction between the second region 2 and the first region 1, the first and second device terminals $T_1$, $T_2$ would be shorted through their portions in ohmic contact with the first region 1, making the presence of the second to fifth regions totally meaningless.

An object of the present invention is to provide a surge protection device of the breakover type that is capable of absorbing surges irrespective of the polarity thereof without need for the aforesaid ohmic electrode structure with respect to the first region, and which is capable of preventing misoperation under exposure of the device to a small surge.

Another object of the invention is to provide a surge protection device enabling highly precise control of the breakover current $\pm I_{BO}$ and hold current $\pm I_H$ preferably with increase design freedom. This object of the invention also contributes to keeping the device from responding to a surge which is small in terms of energy but nevertheless exhibits a large dV/dt.

Another object of the invention is to provide a surge protection device exhibiting a large surge absorption capacity.

SUMMARY OF THE INVENTION

This invention provides a vertical type surge protection device for absorbing surges of either polarity, comprising:

a) a first region formed of a semiconductor of one conductivity type, b) a second region formed of a semiconductor of opposite conductivity type from the semiconductor of the first region and forming a first pn junction with the first region, c) a third region formed of N number of sub-regions of semiconductor of the one conductivity type which are arranged side by side at least within a section perpendicular to a surface of the third region, the third region contacting the side of the second region opposite from that in contact with the first region and being capable of injecting into the second region carriers that are minority carriers to the second region, d) a fourth region formed of a semiconductor of the opposite polarity type and forming a second pn junction with the first region, e) a fifth region formed of M number of sub-regions of a semiconductor of the one conductivity type which are arranged side by side at least within a section perpendicular to a surface of the fifth region, the fifth region contacting the side of the fourth region opposite from that in contact with the first region and being capable of injecting into the fourth region carriers that are minority carriers to the fourth region, f) a first ohmic electrode provided to contact the surface of the fifth region sub-regions and the surface of the fourth region on both sides of the fifth region sub-regions along a first direction ($x_2$) in said surfaces, g) a second ohmic electrode provided to contact the surface of the third region sub-regions and the surface of the second region on both sides of the third region subregions along a second direction ($x_1$) in said surfaces, h) the length $x_{E1}$ of the respective third region sub-regions in the second direction ($x_1$) or the length $x_{E2}$ of the respective fifth region sub-regions in the first direction ($x_2$) being, determined, on the basis of a value dV/dt defined as a noise rise sharpness at or below which response is not desired, in accordance with an equation (Eq. 10) established for reasons that will be explained in connection with embodiments set out later.

This arrangement enables absorption of surges irrespective of which of the first and second ohmic electrodes the surge causes to become positive and, moreover, increases resistance to noise referred to as "small surges".

In accordance with another of its features, the invention provides a two-terminal, breakover type surge protection device capable of absorbing surges of either polarity in which, with regard to the absolute value $I_{Hmax}$ of the maximum permissible hold current within the range in which the breakover state can be maintained irrespective of the polarity of the surge occurring across the first and second device terminals, the lower limit of the x-direction length of the third region or fifth region sub-regions is determined in accordance with an equation (Eq. 13) which will be set out later and in which the area of the second region or the fourth region is defined as $S_B$ and the upper limit of the length $x_E$ is determined not only in accordance with Eq. 10 but also, in view of the absolute value $I_{Hmin}$ of the minimum hold current value required for maintaining the breakover state, in accordance with an equation (Eq. 12) which will be set out later. With this arrangement, the required maximum and minimum hold current values can be obtained by selecting the x-direction length $x_E$ of the third region or fifth region sub-regions.

The invention further provides a two-terminal, breakover type surge protection device capable of absorbing surges of either polarity in which the third region and fifth region sub-regions have a circular shape or nearly circular shape as observed in plan view, the first ohmic electrode has portions which contact the surface of the fourth region and the surface of the circular or nearly circular fifth region sub-regions along all or most of their circumference, the second ohmic electrode has portions which contact the surface of the second region and the surface of the circular or nearly circular third region sub-regions along all or most of their circumference, and the diameter $x_E$ of the third or fifth region sub-regions is made subject to a condition in accordance with an equation (Eq. 10') which will be set out later. With this arrangement, it is possible to absorb surges irrespective of whether the polarity of the surge causes the device terminal $T_1$ or the device terminal $T_2$ to become positive and, moreover, to increase resistance to noise referred to as "small surges".

The above and other features of the present invention will become apparent from the following description made with reference to the drawings.

DESCRIPTION OF THE PREFERRED EMBODIMENTS

Figure 1A:
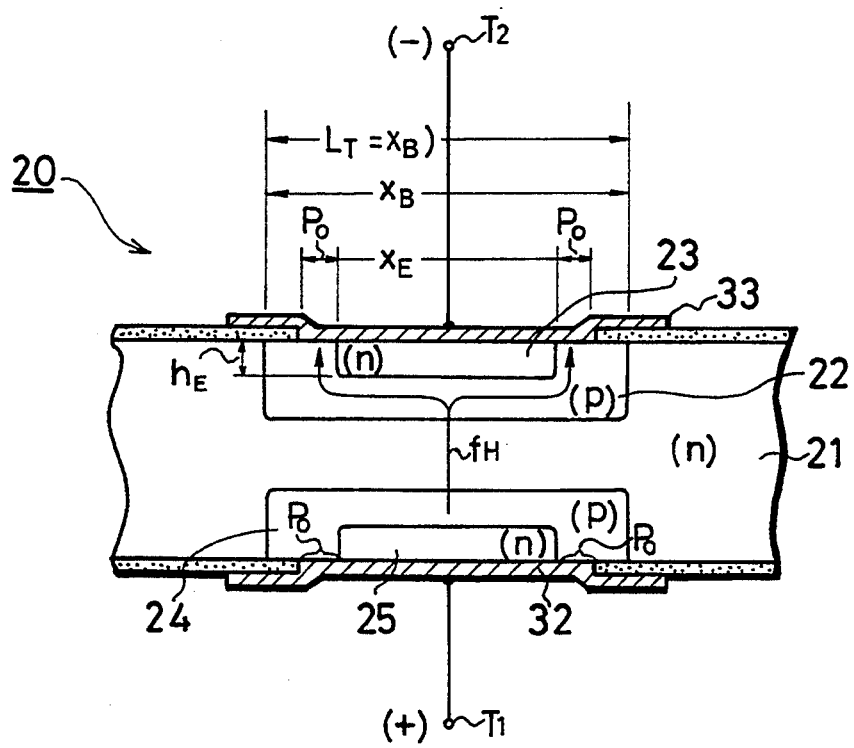
FIG. 1(a) is a schematic sectional view of an embodiment of a two-terminal, breakover type surge protection device capable of absorbing surges of either polarity according to the invention.
Figure 1B:
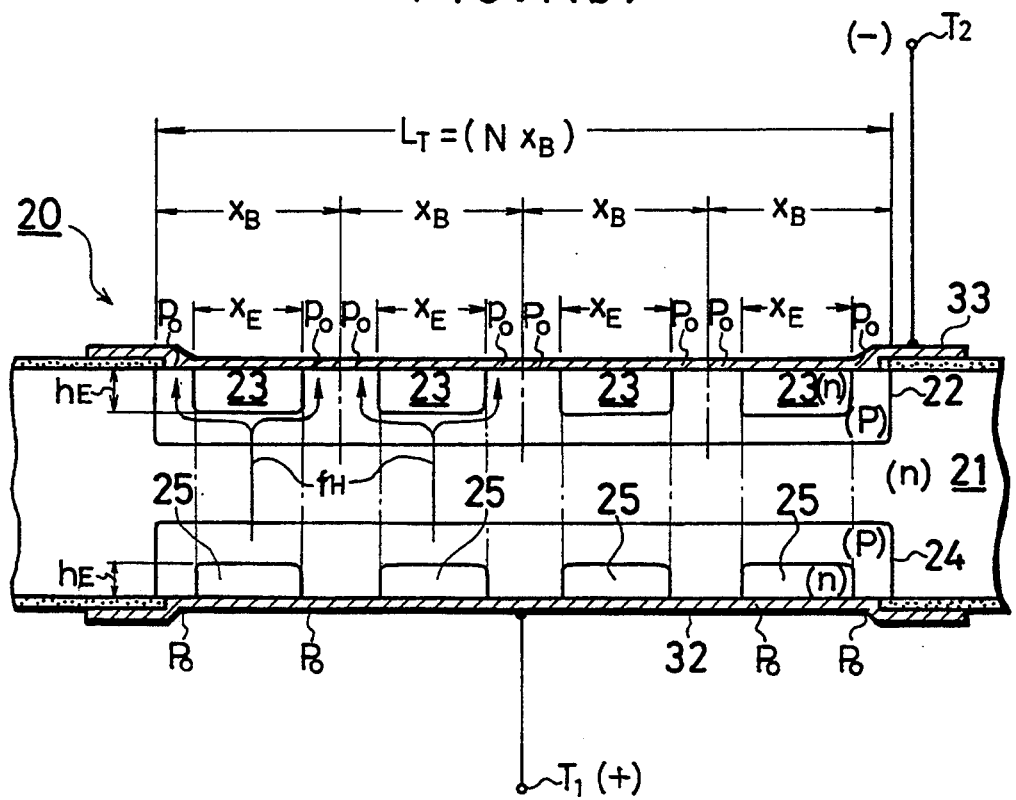
FIG. 1(b) is a schematic sectional view of another embodiment of a two-terminal, breakover type surge protection device capable of absorbing surges of either polarity according to the invention.

FIGS. 1(a) and 1(b) show vertical type surge protection devices 20 according to first and second preferred embodiments of the invention. Throughout the embodiments illustrated in the drawings, identical reference symbols indicate identical or similar members. Frequently such members will be explained only the first time they are referred to. Insofar as it is not explicitly stated to the contrary, members designated by identical reference symbols and the modifications thereof explained in the specification can be used interchangeably among all of the embodiments.

The devices 20 illustrated in FIG. 1(a) and 1(b) each comprises a first semiconductor region 21 which is an n-type semiconductor substrate obtained from a semiconductor wafer. On one principal surface of the first semiconductor region 21 is formed a second semiconductor region 22 of the opposite conductivity type from the first semiconductor region 21. The first semiconductor region 21 and the second semiconductor region 22 form a first pn junction. A third semiconductor region 23 of n conductivity type is formed on the side of the second semiconductor region 22 opposite from that in contact with the first semiconductor region 21.

A fourth p conductivity type semiconductor region 24 is formed on the other principal surface of the first semiconductor region 21, thereby forming a second pn junction. A fifth semiconductor region 25 of n conductivity type is formed on the side of the fourth semiconductor region 24 opposite from that in contact with the first semiconductor region 21. The second semiconductor region 22 and the fourth semiconductor region 24 are physically equivalent regions, as are the third semiconductor region 23 and the fifth semiconductor region 25. These physically equivalent pairs are also preferably geometrically identical. Specifically, it is preferable for them to have the same area and thickness and to be located as opposed to each other across the intervening first semiconductor region 21. Hereinafter, the semiconductor regions 21-25 will be referred to as simply "regions" 21-25.

In the structure shown in FIG. 1(a), the third region 23 and the fifth region 25 are single regions, while in the structure shown in FIG. 1(b) the third region 23 and the fifth region 25 are each constituted of a plurality (four in the example illustrated) of sub-regions at least in the section shown in the drawing. In the case of these embodiments to be first explained, the third region (sub-regions) 23 and the fifth region (sub-regions) 25 each has a rectangular profile having a long-side direction and a short-side direction. The sections shown in the drawings are taken along the short-side directions.

In the case of the structure shown in FIG. 1(b), the N sub-divisions of the third region 23 in the illustrated section can be in connection with each other at their lengthwise ends. Similarly, M sub-divisions of the fifth region 25 can also be in connection with each other at their lengthwise ends. For convenience in discussing FIGS. 1(a) and 1(b) together, the numbers N and M are each defined as having a value of 1 or greater. The structure shown in FIG. 1(a) therefore corresponds to a case in which M and N equal 1 and the structure shown in FIG. 1(b) to a case in which they equal 4.

In forming the regions 21, 22, 23, 24, 25 with respect to the first region 21 so as to have the desired conductivity type, thickness and impurity concentration, it is possible, for example, to use the techniques for selective diffusion of boron (p type) or phosphorus (n type) or to adopt an appropriate one from among the numerous other prior art technologies available. Moreover, it is also possible to reverse the conductivity types of all five regions 21, 22, 23, 24, 25. In this case the directions of the operation and device currents merely become the opposite from those explained in the following. Aside from this point, the following explanation also applies substantially as it is to the devices modified in this manner.

The surge protection device 20 is essentially a two-terminal device. One of the two terminals, the first device terminal $T_1$, is in electrical connection with a first ohmic electrode 32 that is in ohmic contact with the surface of the fifth region 25 sub-regions and with the fourth region 24 at portions $P_o$, $P_o$ on the opposite sides of the fourth region 24 sub-regions, while the other, second device terminal $T_2$, is in electrical connection with a second ohmic electrode 33 that is in ohmic contact with the surface of the third region 23 sub-regions and with the second region 22 at portions $P_o$, $P_o$ on the opposite sides of the third region 23 sub-regions.

In the embodiments of both FIGS. 1(a) and 1(b) the portions of the surface not in contact with the first and second ohmic electrodes 32, 33 are coated with an insulating layer.

The surge protection devices 20 shown in FIGS. 1(a) and 1(b) are both bipolar, two-terminal, breakover type surge protection devices able to absorb surges equally well irrespective of whether the polarity of the surge causes the device terminal $T_1$ or the device terminal $T_2$ to become positive. They are also devices which do not respond to the "small surges" referred to earlier.

Figure 8:
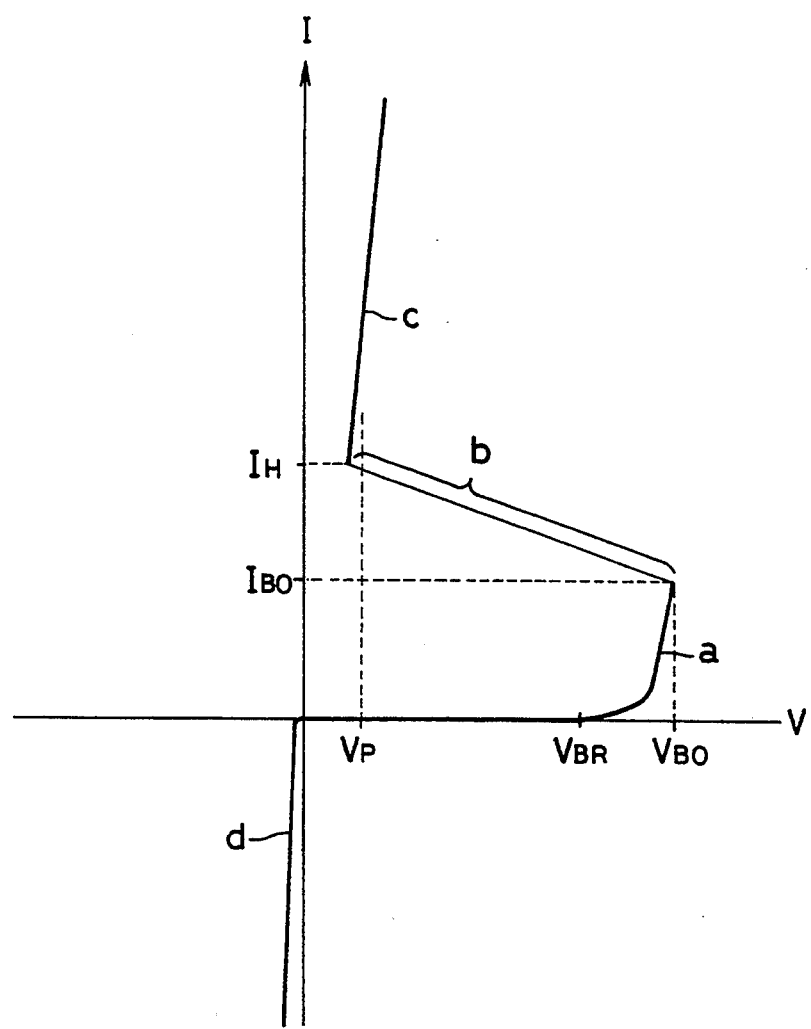
FIG. 8 is a graph showing the surge absorption characteristics of the conventional device of FIG. 7.

In the case where the device is subjected to a surge causing the first device terminal $T_1$ to become positive and the second device terminal $T_2$ to become negative, since the first device terminal $T_1$ is in direct electrical contact with the fourth region 24 via the first ohmic electrode 32, the condition is operationally equivalent to that in which the fifth region 25 is not present. Therefore, a basic surge absorption operation with negative characteristics is realized, in the manner described earlier with respect to the prior art, by dint of punch-through or avalanche breakdown, Zenner breakdown or other such mechanism caused by reverse biasing of the first pn junction between the first region 21 and the second region 22. In the surge protection device 20 according to FIGS. 1(a) and 1(b), therefore, the breakover characteristic curve with respect to a surge that causes the first device terminal $T_1$ to become positive is as shown in the first quadrant of FIG. 4. This corresponds to the characteristic curve of the conventional unipolar surge protection device shown in FIG. 8.

On the other hand, when the surge protection device 20 according to the invention is subjected to a surge causing the first device terminal $T_1$ to become negative and the second device terminal $T_2$ to become positive, it again operates in exactly the same manner as explained in the foregoing. More specifically, since the second device terminal $T_2$ is in direct electrical contact with the second region 22 via the second ohmic electrode 33, the condition is operationally equivalent to that in which the third region 23 is not present. Therefore, the second region 22 performs the function of the fourth region 24 described earlier, while the fifth region 25 performs that of the third region 23 described earlier.

Figure 4:
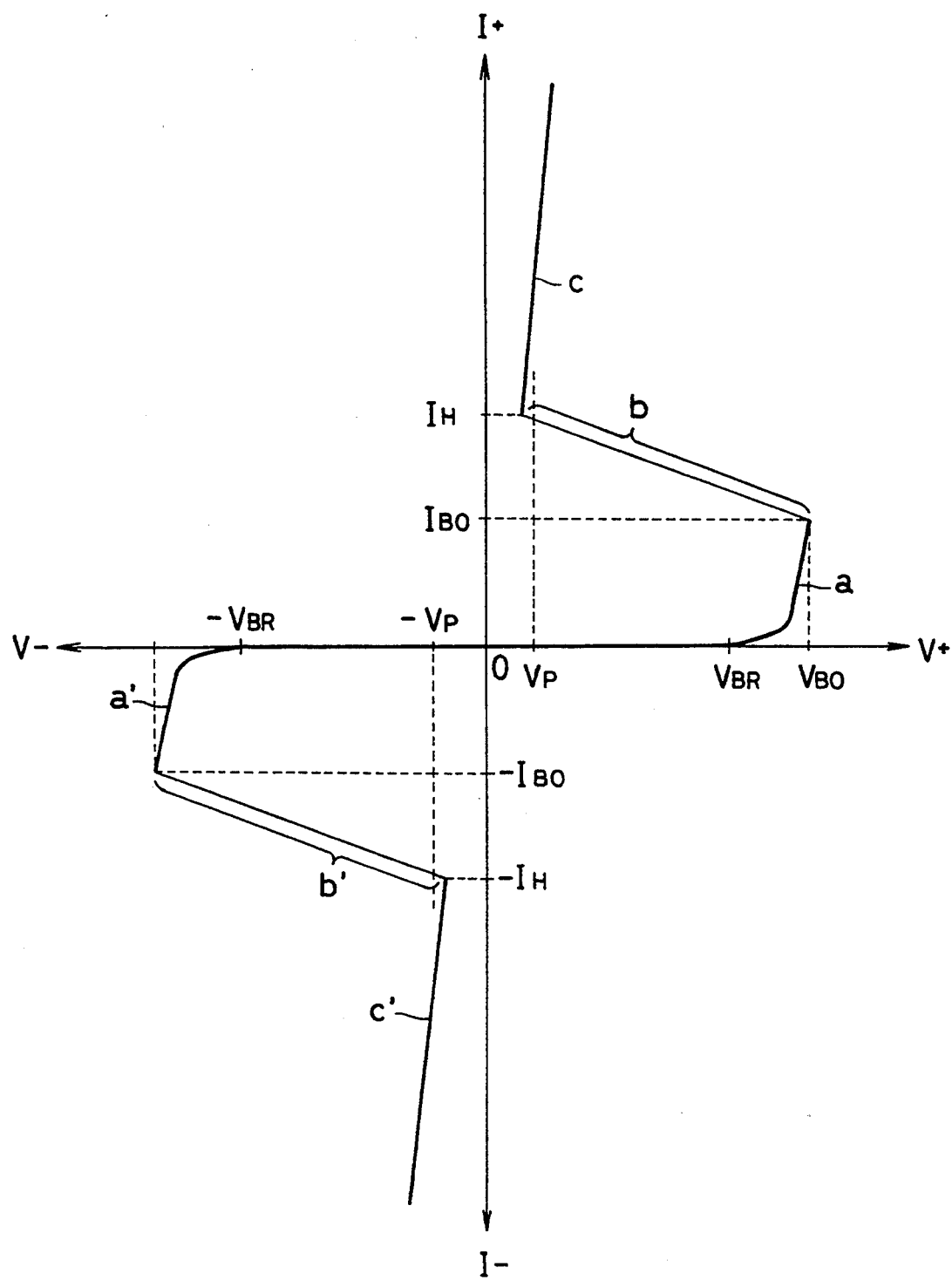
FIG. 4 a graph showing the voltage vs current characteristics of a two-terminal, breakover type surge protection device capable of absorbing surges of either polarity according to the invention.

In the surge protection device 20 according to FIGS. 1(a) and 1(b), therefore, the breakover characteristic curve with respect to a surge that causes the first device terminal $T_1$ to become negative is as shown in the third quadrant of FIG. 4 and, with respect to the origin, is symmetrical to the characteristic curve in the first quadrant. Insofar as the production parameters of the corresponding regions are identical, the breakdown voltage $-V_{BR}$, breakover voltage $-V_{BO}$, breakover current $-I_{BO}$ and hold current $-I_H$ in the third quadrant will be the same in absolute value to the breakdown voltage $V_{BR}$, breakover voltage $V_{BO}$, breakover current $I_{BO}$ and hold current $I_H$ in the first quadrant. This means that the portions a, b and c of the characteristic curve of FIG. 4 correspond to portions a, b and c in FIG. 8, while the portions a', b' and c' of the characteristic curve in FIG. 4 are symmetrical to the portions a, b and c in FIG. 8 with respect to the origin.

As explained in the foregoing, the present invention thus provides a device which is capable of absorbing surges of either polarity and which, based on techniques that will be explained later, enables improved resistance to the aforesaid "small surges" (i.e. noise whose peak voltage is of a magnitude not requiring absorption but which rises sharply and thus exhibits an extremely large dV/dt) and which is also able to stabilize its breakover voltage $\pm V_{BO}$ strictly at the design value.

While falling in the category of a structural expedient or precondition, the first ohmic electrode 32 for electrically connecting the fourth region 24 and the fifth region 25 with respect to the first device terminal $T_1$ is, as indicated by Po, Po, in contact with the surface of the fourth region 24 at either side of the portion in contact with each fifth region 25 sub-region. Similarly, the second ohmic electrode 33 for electrically connecting the second and third regions 22, 23 with respect to the second device terminal $T_2$ extends onto the surface of the second region 22 at either side of the portion in contact with each third region 23 sub-region, as indicated by $P_o$, $P_o$. The effect of limiting the pattern in this manner can be explained as follows.

Figure 2:
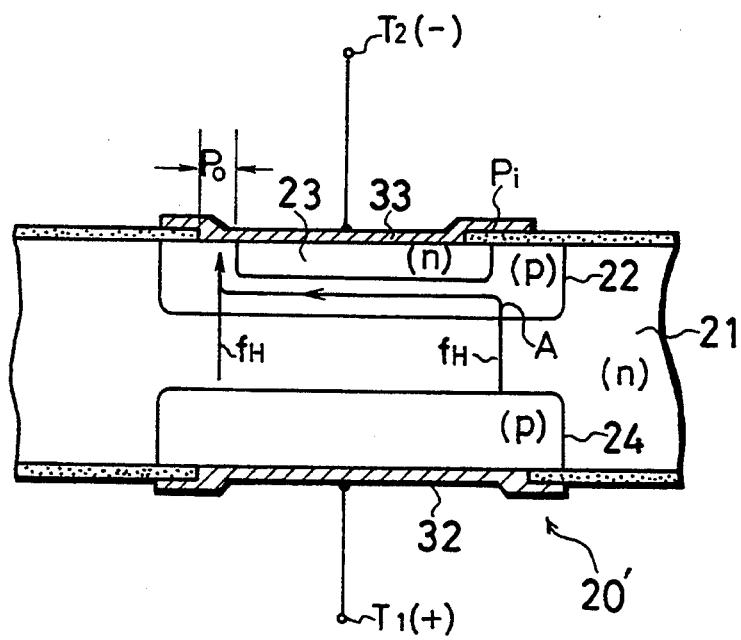
FIG. 2 is a sectional view for explaining a hypothetical device, not in accordance with the invention, in which the ohmic electrodes for the second region and the third region are deliberately fabricated to be asymmetrical.

In fabricating the surge protection device to have a vertical structure, presume that, in the manner of the hypothetical device structure 20' shown in FIG. 2 (which for simplicity is indicated as a unipolar surge absorption device lacking the fifth region 25), the second ohmic electrode 33 intended to make ohmic contact with both the third region 23 and the second region 22 should make contact with the second region 22 only at $P_o$ on one side of the third region 23 and the contact extremity $P_i$ on the laterally opposite side should reach only onto the surface of the third region 23. In this case, if a surge of larger than a prescribed magnitude should occur across the first and second device terminals $T_1$, $T_2$ in the indicated polarity ($\pm$, $+$), then the minority carrier current (hole current) $f_H$ injected into the first region 21 from the fourth region 24 immediately upon direct breakdown of the junction between the first region 21 and the second region 22 or upon punch-through between the first region 21 and the third region 23 would, in part, reach the portion $P_o$ of the second ohmic electrode 33 via the shortest possible route by passing through the first region 21 in its thickness direction, but other portions of the hole current $f_H$ passing through points apart from the portion $P_o$, such as that indicated by point A in FIG. 2, would not be able to reach the second ohmic electrode 33 unless by traveling a fairly long distance along the bottom of the third region 23.

Since this means that the voltage drop resulting from the flow of the hole current $f_H$ along the path passing through point A would become large more quickly than the voltage drop resulting from the hole current along relatively shorter routes, turn-on would start from the end region in the vicinity of point A. Local breakover of this type would disrupt a uniform current distribution, would variously fluctuate the process of forward biasing the second region 22 and the third region 23, and would degrade device designability. Breakover current $I_{BO}$ and hold current $I_H$ controllability would of course also be degraded, and it would also become difficult to obtain the surge absorption capacity increase in proportion to the device area. Moreover, an ohmic electrode structure of this type might also increase misoperation in response to noise of the type referred to as "small surges," which is one of the problems addressed by the present invention. This is because if the hole current $f_H$ based on the displacement current $i_t$ explained earlier with reference to Eq. 1 passes through the point A, a voltage sufficient for forward biasing the third region 23 may be easily produced at the point A. In particular, where punch-through is used as the breakdown mechanism, the resistance of this portion of the second semiconductor region 2 becomes very high immediately after the occurrence of punch-through and, as a result, the forward bias voltage $V_f$ is produced even by a very small current.

Figure 1C:
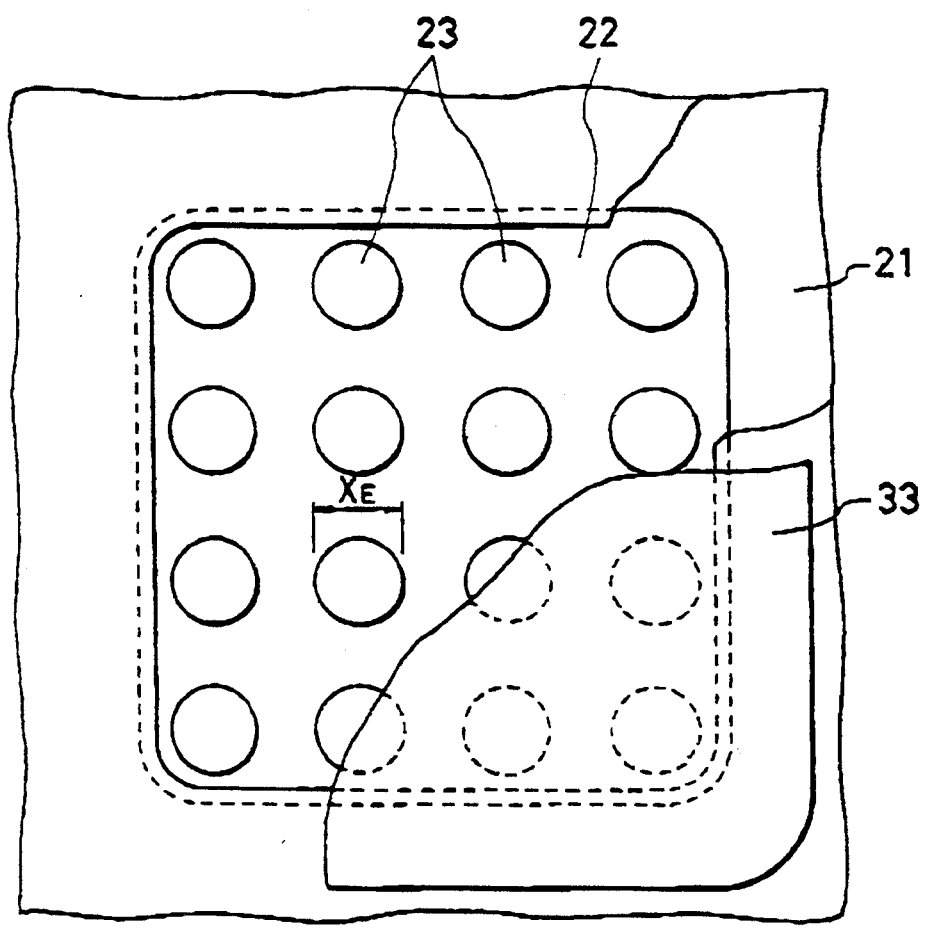
FIG. 1(c) is a partially cutaway schematic plan view of still another embodiment of a two-terminal, breakover type surge protection device capable of absorbing surges of either polarity according to the invention, in which third semiconductor region sub-regions and fifth semiconductor region sub-regions are substantially circular and which also appears in FIG. 1(b) when taken along a line passing through the diameters of the lateral row of circles.

In contrast, when, as shown in FIG. 1, the first and second ohmic electrodes 32, 33 are both constituted to have the portions $P_o$, $P_o$, the hole current $f_H$ injected into the first region 21 from the second region 22 or the fourth region 24 (depending on the surge polarity; the following description assuming injection from the fourth region 24) or the hole current $f_H$ accompanying the displacement current $i_t$ will, as it passes from under the third region 23 around both sides thereof in the manner shown schematically by the arrows in FIG. 1, flow uniformly, whereby the controllability of the breakover current and the hold current will be improved, the surge absorption capacity will be enhanced and the average current path will be shortened to provide some degree of resistance to the displacement current $i_t$. It will be understand that under a surge of the opposite polarity, the arrows $f_H$ point from the second region 22 toward the opposite side portions $P_o$, $P_o$ of the fifth region 25 sub-regions.

Taking into consideration the fact that the length of this current path makes it possible that even a current of small value may have the effect of forward biasing the third region 23 or the fifth region 25 at the wrong time and, further, in view of such circumstances as the desire to achieve every possible increase in resistance to "small surges" and, as will be explained later, to obtain a relatively large hold current $\pm I_H$, it is preferable in the case where the plan-view shape of the third region 23 sub-regions is rectangular to provide the portions $P_o$, $P_o$ of the ohmic electrodes extending onto the surface of the second semiconductor region in the illustrated manner only in the direction of the short side of the rectangle. When, as referred to later, the plan-view shapes of the third region 23 sub-regions and the fifth region 25 sub-regions are circular, nearly circular, regular polygonal or nearly regular polygonal, for ensuring that a sectional structure like that in FIG. 1 will be obtained regardless of the direction within the surface in which the section is taken, it is preferable to provide the ohmic electrode portions $P_o$, $P_o$ so as to contact the second and fourth regions 22, 24 along all or most of the circumferences of the third and fifth region sub-regions as observed in plan view.

The direction along which the portions $P_o$, $P_o$ are disposed is here defined as the x direction and, moreover, the x direction is coincident with the short side direction of the third and fifth region sub-regions. There is, however, no direct relationship between the x direction and the direction along which the plurality of rectangular third and fifth region sub-regions shown in FIG. 1(b) are disposed. While these directions coincide in the drawing, this is not required and they may, for example, be perpendicular to each other.

Regarding alignment of the third and fifth region sub-regions, however, it should be noted that all N number of third region 23 sub-regions and all M number of fifth region 25 sub-regions should preferably have the same dimensions and areas and be disposed at equal intervals. This is because geometric uniformity produces current uniformity. When these sub-regions are of circular or regular polygonal shape, the portions $P_o$ are preferable formed around the entire circumferences thereof and it therefore becomes meaningless to speak of the portions $P_o$ extending in the direction in which the third and fifth region sub-regions are aligned. Nevertheless, it is of course still preferable for the third and fifth region sub-regions to have identical areas and be disposed at equal intervals. Two dimensional alignment of the third and fifth region sub-regions within the surface is also possible. In this regard, it was in fact found that when the third and fifth regions 23, 25 were not constituted as single regions as indicated in FIG. 1(a) but were constituted as a plurality of sub-regions disposed equidistantly in at least within one section extending in the x direction, a more uniform current distribution and larger value of breakover current $\pm I_{BO}$ and hold of current $\pm I_H$ were obtained, and the surge absorption capacity $I_{pp}$ increased generally in proportion to the device area.

Turning again to the displacement current $i_t$ defined by Eq. 1 mentioned earlier, this current will not cause misoperation of the device insofar as its magnitude is smaller than the current value $I_{ff}$ (absolute value) required for forward biasing the third region 23 (when the polarity is such as to make the first device terminal $T_1$ positive) or the fifth region 25 (when the polarity is such as to make the second device terminal $T_2$ positive). The present invention defines the conditions for this.

To make the explanation easier to understand, however, only the case where the first device terminal $T_1$ is positive will be taken up in the following. As far as the ensuing explanation is concerned, therefore, the presence of the fifth region 25 can be ignored. As regards the operation of the device under a surge of the opposite polarity, it suffices to read "third region 23" as "fifth region 25" and to ignore the presence of the third region 23. Likewise, "M fifth region sub-regions" should be read as "N third region sub-regions."

When, as shown in FIG. 1(b), there are N (=4) rectangular third region sub-regions each measuring $x_E$ in the x direction (the direction in which the short sides of the rectangle extend in this case), the x-direction width of each corresponding second region 22 sub-region obtained by dividing the short-side length of the second region 22 by N is defined as $X_B$. In other words, the overall length of the second region 22 in the x direction becomes $$L_T = N \cdot X_B \quad (2)$$

Each portion of the device constituted by a single second region sub-region having an x-direction length $X_B$ and a single third region 23 sub-region positioned to be laterally centered within the second region sub-region will be referred to as a "structural unit". By this definition, the surge protection device according to the invention shown in FIG. 1(b) can be seen as being constituted of four unit structures each consisting of a single third region 23 sub-region having an x-direction length of $X_E$ laterally centered within a second region 22 having an x-direction width $x_B$, the four unit structures being aligned laterally with the second region portions of adjacent ones thereof in contact with each other. By the same token, the surge protection device 20 according to the invention shown in FIG. 1(a) corresponds to a special case in which N=1.

Notwithstanding that the x-direction length $x_E$ of the third region 23 sub-regions is determined in accordance with an equation defining limits according to the invention, it may nevertheless have various different absolute values. For example, it is possible for the total x-direction length $4 \cdot X_E$ of the four third region sub-regions shown in FIG. 1(b) to be equal to the x-direction length $X_E$ of the single third region sub-region of FIG. 1(b) (it being understood that FIGS. 1(a) and 1(b) are not necessarily to the same scale). In other words, the total x-direction length X of the third region 23 can be constituted by a single wide third region 23 of length X or by N number of third region sub-regions each having an x-direction length $X_E$ equal to X/N.

At any rate, for the reasons explained earlier, where N is an integer not smaller than 1, the displacement current $i_t$ occurring as a result of a "small surge" across the first and second device terminals $T_1$, $T_2$ can be considered to amount to $i_t/N$ with respect to each of the N number of the third region 23 sub-regions. This is only natural from the fact that the junction capacitance per unit structure is one Nth the total junction capacitance $C_j$ between the first region 21 and the second region 22. Moreover, the current required for forward biasing each of the N third region sub-regions can be considered to be one Nth the current $I_{ff}$ required for forward biasing all of the third semiconductor region sub-division.

Let us here define the following symbols not defined in the foregoing:

$Y_E$: length of third region 23 in the y direction
$Y_B$: length of second region 22 in the y direction
$\rho_B$: sheet resistance of the second region at the portion between the first and third regions The current density J of the current $I_{ff}$ required for forward biasing the N sub-regions of the third region 23 can be expressed as $$J = I_{ff}/N \cdot x_B \cdot Y_B \quad 3)$$

The denominator on the right side of Eq. 3 is the area $S_B$ of the second region 22 (=$N \cdot x_B \cdot Y_B$). It also means that, as regards the second region 22 considered, as an expedient, to be divided into structural units in the foregoing, it suffices to consider the total area thereof, irrespective of the planar shape or number of third region 23 sub-regions.

On the other hand, while the forward voltage $V_f$ at the time the third region 23 is on is generally around 0.5 V, the point at which the voltage drop corresponding to the forward voltage $V_f$ occurs most readily for one and the same current value as a result of the current traversing a long path along the bottom surface of the third region sub-region is, in the case of the device structure according to the invention shown in FIG. 1 and as stated earlier, at the lateral (x-direction) center of the bottom of the third region 23 sub-region concerned, owing to the fact that the second ohmic electrode 33 is in contact with the second region 22 sub-region at the portions $P_o$, $P_o$ at the opposite sides thereof in the x direction. This point is substantially the same as that at which the hole current schematically indicated by the arrow $f_H$ in the drawing is shown to branch to the left and right. In view of the fact that the third semiconductor region 3 sub-region is turned on by a current that branches equally to the left and right in this manner, it suffices to take into consideration the voltage drop along the bottom surface of the third region 23 sub-region only with regard to the half to the left or right of the x-direction center of the third region 23 sub-region.

The forward biasing voltage $V_f$ can thus be expressed in terms of the current density J of Eq. 3 as $$\int_0^{x_E/2} \rho_B \cdot J \cdot x \, dx = V_f \quad 4)$$

Calculating this and solving for J, we get $$J = \frac{8 V_f}{\rho_B \cdot x_E^2} \quad 5)$$

Thus, assuming Eq. 3 and this Eq. 5 to be equal as regards current density J and solving for the total current $I_{ff}$ required for forward biasing N third region 23 sub-regions, we get $$I_{ff} = \frac{8 V_f \cdot S_B}{\rho_B \cdot x_E^2} \quad 6)$$

On the other hand, the junction capacitance between the first region 21 and the second region 22 can be expressed in terms of the junction capacitance per unit area $C_o$ as $$C_j = C_o \cdot S_B \quad 7)$$

Therefore, when a surge with a rise rate or sharpness dV/dt occurs across the first and second device terminals $T_1$, $T_2$, the accompanying displacement current $i_t$ of Eq. 1 can be reexpressed as $$i_t = C_o \cdot S_B \cdot (dV/dt) \quad 8)$$

Since for forward biasing the third region by the displacement voltage $i_t$ it therefore suffices to satisfy the relationship $$i_t < I_{ff} \quad 9)$$

it is, from the Eqs. 6, 8 and 9, possible to obtain the following important result by solving for the x-direction length $x_E$ of each of the N third region 23 sub-regions $$x_E < \sqrt{\frac{8V_f}{\rho_B \cdot C_o \cdot (dV/dt)}} \qquad 10)$$

Thus, while the impedance of the circuit to be protected is also a factor, once the maximum value of dV/dt has been decided on the basis of the sharpest (most rapidly rising) surge that can be expected or on the basis of a surge of a sharpness below which no protection is required and at least up to which it is desired to avoid misoperation, then, since the other parameters all already known, the upper limit of the x-direction length $x_E$ at the time of forming the third region 23 can be determined by substituting the know parameters and the so determined value of dV/dt into Eq. 10. Moreover, it is a particularly notable feature that the y-direction length $Y_E$ of the third region 23 sub-regions, the area $S_b$ of the second region 22 and the like have no bearing on Eq. 10. Because of this, the number of error factors related to dimensional parameters is reduced at the time of actually fabricating the respective regions.

The same can also be said in the case where the third region 23 sub-regions are formed to be circular, nearly circular, regular polygonal or nearly regular polygonal, provided that the term "8 $V_f$" under the root sign in Eq. 10 is changed to "16 $V_f$". Specifically, as shown in FIGS. 1(1) and 1(c), where the third region 23 sub-regions are formed in the shape of circles having a diameter of $x_E$, then, since the portion $P_o$ of the second ohmic electrode 33 is provided along all or most of each third region sub-region, the hole current $f_H$ flowing in the thickness direction (depth direction) toward the center the third region 23 sub-region will fan out into a uniform radial flow along the bottom of the third region 23 sub-region.

Therefore, when the amount of current increase relating to the amount of area increase for a small increment in radius is calculated, an equation for calculating the resistance value for the area from the center up to an arbitrary position x is established, and equations for the conditions under which the voltage drop at the center is smaller than the aforesaid forward bias voltage $V_f$ are worked out, it is found that, as stated above, only the coefficient changes and that Eq. 10 can, defining $x_E$ as the diameter of the third region 23 sub-region, be rewritten as $$x_E < \sqrt{\frac{16V_f}{\rho_B \cdot C_o \cdot (dV/dt)}} \qquad 10')$$

Figure 7:
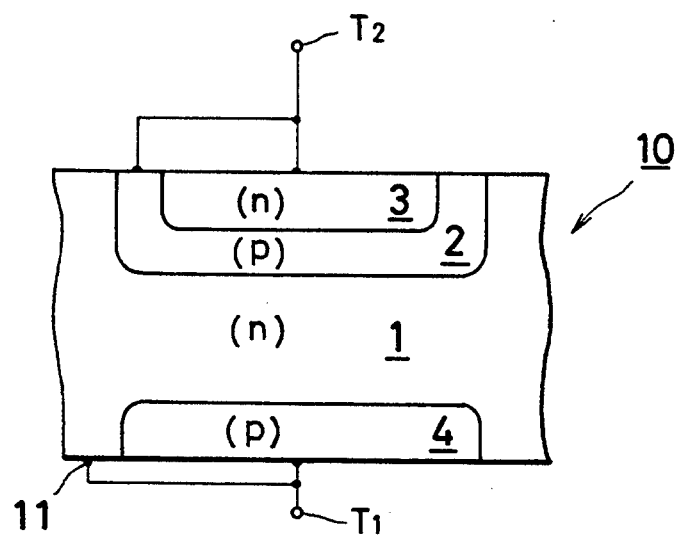
FIG. 7 is a diagram illustrating the principle of the conventional surge protection device capable of absorbing surges of only one polarity.

This condition is substantially satisfied by a regular polygon of a shape close to that of the circle having the diameter determined in this manner. In other words, where the sub-regions of the third region 23 are regular or nearly regular polygonal in shape, it suffices to consider Eq. 10' to relate to the diameters $X_E$ of the circles whose areas are equal to those of the regular or nearly regular polygons. One of the most fundamental objects of this invention is achieved by providing a way for coping with noise exhibiting a high dV/dt value which, differently from the conventional arrangement of FIG. 7 for example, does not rely on the technique of charging the junction capacitance $C_j$ between the first and second regions 21, 22 by causing majority carriers (from the viewpoint of the first region 21) to be injected into the first region 21 through an ohmic electrode separately provided on the first region 21, i.e. does not use a technique which cannot be incorporated in a bipolar surge absorption device.

Particularly in the case where punch-through is used as the breakdown mechanism, the sheet resistance of the second region present between the first and third regions becomes considerably high after the occurrence of punch-through between these two regions. However, since the depletion layer contracts once current begins to flow through these regions, the sheet resistance, at least that at the portion where the current clings close to the third region, becomes equal or close to that which would normally be expected of the second region for the current value at that time. The aforesaid sheet resistance can therefore be set as the sheet resistance of the second region in such case. On the other hand, in the case of avalanche breakdown, since the depletion layer does not extend within the second region to near the third region, the resistance here does not become exceptionally large owing to the sheet resistance of the second region as a function of the current value at this time.

As was mentioned earlier, Eqs. 10 and 10' apply not only to the third region 23 sub-regions but also to the fifth region 25 sub-regions. The thickness he of the third and fifth region (sub-regions) can be used as an auxiliary factor in determining their x-direction lengths $x_E$ or their diameters $x_E$. Generally speaking, however, the thickness $h_E$ of the third and fifth regions is exceedingly small in comparison with their short-side width or diameter, even where these are made quite short, and is typically no more than around 1-2 $\mu$m. Moreover, even where the thickness is somewhat greater as in the case of an avalanche breakdown type device (but is still generally on the order of several $\mu$m), if the third region 23 is formed with respect to the second region 22 and the fifth region 25 with respect to the fourth region 24 by diffusion, since the diffusion resistance in the lateral direction to both sectional sides of the third and fifth region sub-regions will be much lower than the resistance of the second and fourth regions under the third and fifth region sub-regions, it will be possible to ignore the effect of the thickness $h_E$ of the third and fifth regions.

The second object of this invention includes that of enabling good control of the hold current $\pm I_H$. While the required value of the hold current $\pm I_H$ is determined as one which, in light of the impedance of the circuit to be protected and the magnitude of the current used by the circuit during normal operations, will enable quick return to the high insulating off state after surge subsidence, it is, on the other hand, not a simple matter of a higher hold current being better. Needless to say, there is no advantage in setting it to such a high value that the surge protection device will self-destruct. It is, however, advisable to set the hold current to a high value within the range that it does not self-destruct.

To facilitate the explanation, the hold current $I_H$ will first be discussed assuming that the plan-view shape of the sub-regions of the third and fifth regions 23, 25 is rectangular. The hold current $I_H$ can be considered to be the sum of the aforementioned current value $I_{ff}$ (absolute value) at the time the injection of minority carriers to all of the N third region 23 sub-regions (or M fifth region 25 sub-regions) within the section of the surface region extending in one direction is stopped and the current value $I_c$ at the time the injection of minority carriers from the back surface side fourth region 24 (or the front surface side second region 22) stops (i.e. $I_H = I_{ff} + I_C$). The current value $I_{ff}$ being as defined by Eq. 6 given earlier, it is necessary for securing the desired hold current $I_H$ even when the current value $I_C$ is zero to replace $I_{ff}$ in Eq. 6 with hold current $I_H$ and then to solve for the x-direction length $x_E$ of the third and fifth region sub-regions. This yields $$x_E = \sqrt{\frac{8V_f \cdot S_B}{\rho_B \cdot I_H}} \qquad 11)$$

The hold current $I_H$ can therefore be determined during device design by using Eq. 11 to calculate candidate x-direction lengths $x_E$ for the sub-regions of the third and fifth regions 23, 25 and then selecting a calculated value which also satisfies the upper limit of the x-direction length according to Eq. 10. Alternatively, taking the opposite approach, where the x-direction length $x_E$ required for obtaining the minimum required hold current $I_{Hmin}$ is shorter than the upper limit of the x-direction length $x_E$ prescribed by Eq. 10, the upper limit equation can be replaced by Eq. 11 to obtain $$x_E < \sqrt{\frac{8V_f \cdot S_B}{\rho_B \cdot I_{Hmin}}} \qquad 12)$$

The smaller of the values yielded by Eq. 10 and 12 is defined as the upper limit and a value smaller than this limit is selected as the x-direction length $x_E$ of the sub-regions of the third and fifth regions 23, 25.

However, since in actual practice Eq. 10 tends to give the larger value, it is generally possible to ensure the minimum required hold current value $I_{Hmim}$ by first determining the dV/dt value representing the rise rate or sharpness of noise at least up to which response is not desired and then calculating the upper limit using Eq. 10.

It is much more advantageous, however, to consider the lower limit for the sub-regions of the third and fifth regions 23, 25 based on a modification of Eq. 11. In other words, it is more practical to focus on how far the x-direction length $x_E$ of the sub-regions of the third and fifth regions 23, 25 can be narrowed without causing the surge protection device to self-destruct.

Specifically, modifying Eq. 11 into an equation defining the lower limit of the x-direction length $x_E$ of the third and fifth region sub-regions for the maximum permissible hold current $I_{max}$ gives $$x_E > \sqrt{\frac{8V_f \cdot S_B}{\rho_B \cdot I_{Hmax}}} \qquad 13)$$

As regards the x-direction length $x_E$ of the sub-regions of the third and fifth regions 23, 25, the invention thus provides Eq. 10 defining the upper limit and Eq. 13 defining the lower limit. A concrete example will now be given.

While a very large number of devices were test fabricated, as a typical one of them there will taken up a device in which the second region 22 was 500 μm square (i.e. the x-direction length $x_B$ and the y-direction length $Y_B$ were both 500 μm), the junction capacitance $C_j$ expectable from the first region 21 was 23 pF, and the sheet resistance of the second region at the bottom surface of the third region was 14,200 Ω/□ at an operating voltage of about 150 V.

It was decided to design the device so as not to respond to a dV/dt value of 100 V/μs or less. Substituting the pertinent values into Eqs. 8 and 9 it was found that a current value $I_{ff}$ of not less than 2.3 mA was adequate for this purpose.

This $I_{ff}$ value and the other values already given were then substituted into Eq. 10, whereby it was found that it would suffice for the short-side width $x_E$ of the sub-regions of the third region 23 to be 175 μm or less. Moreover, by solving Eq. 11 for hold current $I_H$, it was found that even at a short-side width $x_E$ equal to the upper limit of 175 μm, the value of the hold current $I_H$ would be higher than a normally acceptable minimum hold current $I_{min}$ of, say, 100 mA. Next, setting the maximum hold current $I_{Hmax}$ for avoiding self-destruction at 500 mA, the lower limit to which the length could be narrowed was calculated using Eq. 13, whereby a value of about 12 μm for the x-direction length $x_E$ of the respective third region 23 sub-regions was obtained.

In the case of the device parameters according to this example, therefore, the device can be designed to satisfy the required hold current value I. by giving the respective third region 23 sub-regions an x-direction length $x_E$ in the range between a minimum of 12 μm and a maximum of 175 μm. Moreover, as is clear from the operating principle of the device according to the invention, the ability to control the hold current in the foregoing manner makes it possible to also control the breakover current, irrespective of what breakdown mechanism is involved. The design criteria for the fifth region sub-regions are of course the same as those just set out.

The foregoing can also be applied in the case where the sub-regions of the third and fifth regions 23, 25 are circular. In such a case, the aforesaid length $x_E$ is defined as the sub-region diameter, Eq. 10' set out above is used in place of the foregoing Eq. 10, and Eq. 12 is rewritten as $$x_E < \sqrt{\frac{16V_f \cdot S_B}{\rho_B \cdot I_{Hmin}}} \qquad 12')$$

and as the value of the diameter $x_E$ of the respective third region 23 sub-regions for use in designing the device, there is used one smaller than the value of whichever of Eq. 10' and Eq. 12' gives the smaller result.

In exactly the same way, it suffices to use the following equation obtained by modifying Eq. 13 for determining the lower limit of diameter $x_E$ of the sub-regions regions of the third and fifth regions 23, 25 for the maximum permissible hold current $I_{max}$ $$x_E > \sqrt{\frac{16V_f \cdot S_B}{\rho_B \cdot I_{Hmax}}} \qquad 13')$$

In a case where the sub-regions of the third and fifth regions 23, 25 have a regular polygonal shape in plan view, it suffices to form them so that the polygonal area of each is equal to that of the circle having the diameter $x_E$ determined to satisfy Eqs. 10', 12' and 13'. A certain amount of fabrication error is of course tolerable regardless of whether the sub-regions are formed to be circular, regular polygonal or rectangular. Obviously, therefore, it is also permissible for them to be nearly circular or nearly regular polygonal (including the case where a small amount of deformation is deliberately imparted). Moreover, in arranging a plurality circular, regular polygonal or otherwise shaped third and fifth region sub-regions, they need not necessarly be disposed simply in rows and columns but can, for example, alternatively be disposed in a honeycomb formation or the like.

Figure 3:
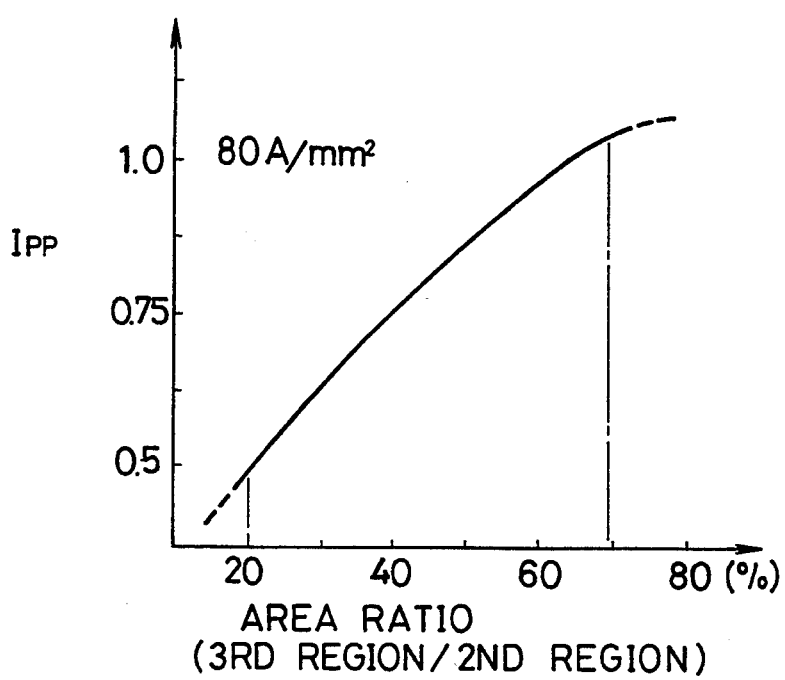
FIG. 3 is a graph for explaining the tendency for the surge absorption capacity to vary as a function of the ratio between the second region and the third region.

Turning next to the surge absorption capacity, the main current path (device current path) of the surge protection device 20 after turn-on passes primarily through the third region 23 and the fourth region 24 in the case of a surge causing the first device terminal $T_1$ to become positive and primarily through the fifth region 25 and the second region 22 in the case of a surge causing the second terminal device $T_2$ to become positive. Therefore, it is easy to understand that the surge absorption capacity increases in proportion as the areas of the third region 23 and the fifth region 25 become larger. For the same reason as mentioned above, whatever is said about the third region also applies to the fifth region. In the interest of simplicity, therefore, the following explanation will be limited to the third region. Using devices in which the third region 23 consisted of a plurality of sub-regions, the ratio between the area of the third region (i.e. $N.x_E \cdot y_E$) 3 and the area $S_B$ of the second region was varied for investigating the effect on the surge absorption capacity $I_{pp}$. The results are shown in FIG. 3. The ratio of third region area ($N.x_E.y_E$) to second region area $S_B$ of the test fabricated devices extended from 67%, which is near the point at which the surge absorption capacity begins to saturate, to 20% on the low end. The actual surge absorption capacities obtained at ratios of 60% and higher were above around 80 A/mm². While devices with a ratio of 20% had only about one half the surge absorption capacity of those with a ratio of 60%, it was confirmed that they exhibited the fundamentally required breakover characteristics. These statements also apply to the fifth region 25.

Even where the total area was the same, however, it was found that the surge absorption capacity tended to be lower in the case where the all of the third and fifth region area were accounted for by a single third region and a single fifth region respectively than in the case where the third and fifth regions 23, 25 were constituted of a plurality of sub-regions within a section of the surface region extending in one direction (irrespective of whether or not the sub-regions were in connection with each other at their ends in the direction perpendicular to the aforesaid direction), particularly when the sub-regions all had the same dimensions. In some cases, the difference was as great as 30%. With respect to the breakover current $\pm I_{BO}$ and the hold current $\pm I_H$, they were considerably changed as referred to earlier. This confirms what was said earlier in connection FIGS. 1(a) and 1(b) about the provision of a plurality of third and fifth region sub-regions being effective for realizing even more uniform current flow.

In a case where it is known that of the minority carriers injected from the fourth region 24 (or the second region 22) a proportion $\beta$ reach the second region 22 (or the fourth region 24), Eq. 10 can rewritten as $$x_E < \sqrt{\frac{8V_f}{\rho_B \cdot C_o \cdot (dV/dt)} \cdot \frac{1}{\beta}} \quad 14)$$

The value of $\beta$ can be determined by measurement or calculation. In the case where the third and fifth regions are of circular, regular polygonal or similar shape, the coefficient 8 under the root sign in Eq. 14 has to be changed to 16.

Eq. 10 and the other equations set out in the foregoing can also be effectively applied in the case where the long-side directions of the sub-regions of the third and fifth regions 23, 25 lie in the x direction. However, since aligning the short-sides in this direction shortens the current path at the bottom surface of the third and fifth regions, this arrangement also structurally increases the resistance to "small surges" exhibiting a high rate of instantaneous voltage change (dV/dt).

Further, in the case where the third and fifth regions 23, 25 are constituted of a plurality of sub-regions within a section of the surface region extending in one direction, it will be understood that it is not necessary for the direction in which these sub-regions are arranged and the direction in which the $P_o$, $P_o$ portions provided on the first and second ohmic electrodes 32, 33 are arranged to be the same. In FIG. 1(b), for example, this can be considered as the state where the portions $P_o$, $P_o$ are aligned in the direction perpendicular to the drawing sheet.

Figure 5:
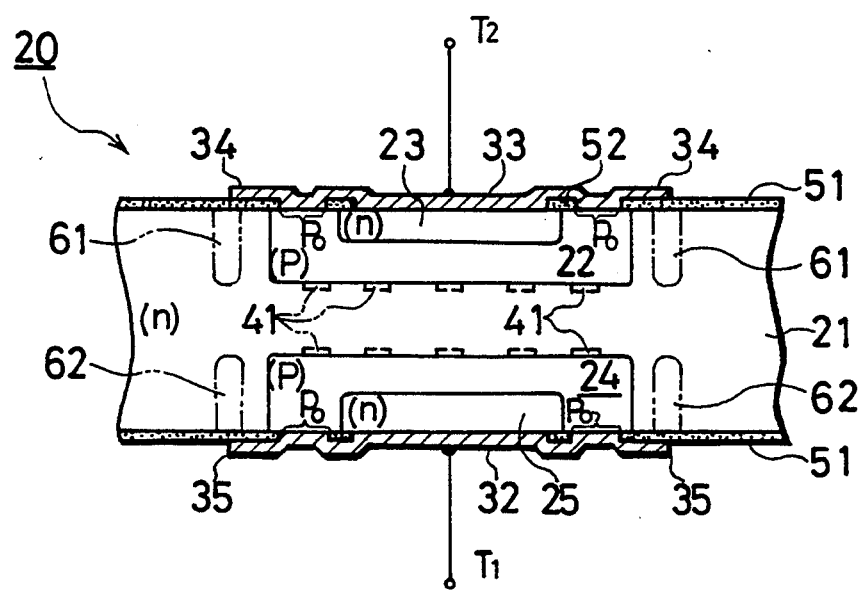
FIG. 5 is a schematic view of another embodiment of the invention having a modified structure.

FIG. 5 shows a modification of the surge protection device 20 according to the invention. When, as indicated by the phantom lines in FIG. 5, high impurity concentration n—regions 41, ... of the same conductivity type as the first region are, as found necessary, provided in the contact area regions between the second and fourth regions 22, 24 and the first region 21, at a plurality of locations and in an appropriate pattern, local concentration of current in the device using an avalanche breakdown mechanism can be avoided.

Moreover, the ohmic electrode 33 in mutual ohmic contact with the second region 22 and the third region 23 is provided with a projection 34 which passes over the boundary of the pn junction between the first region 21 and the second region 22 on the principal surface of the first region 21 and extends from the second region 22 over the first region 21 and the ohmic electrode 32 in mutual ohmic contact with the fourth region 24 and the fifth region 25 is provided with a projection 35 which passes over the boundary of the pn junction between the first region 21 and the fourth region 24 on the principal surface of the first region 21 and extends from the fourth region 24 over the first region 21. These projections constitute so-called field plates 34, 35 which function to mitigate the concentration of electric field at the corners of the first and second pn junctions formed between the first region 21 and the second and fourth regions 22,24 not only in the device using an avalanche breakdown mechanism but also in the device using a Zenner breakdown mechanism or a punch-through breakdown mechanism.

For the same purpose, it is possible to provide guard rings 61, 62 around the second region 22 and the fourth region 24 as indicated by phantom lines. The guard rings 61, 62 are of the same conductivity type as the second and fourth regions but are positioned so as not to make contact therewith. They can be provided either in addition to or in place of the field plates 34, 35.

The embodiment of FIG. 5 is further an example of a device in which the ohmic electrode 33 surface passes over insulation films 52 provided over the portions where the junction between the third region 23 and the second region 22 is exposed on the front surface and the ohmic electrode 32 passes over insulation films 52 provided over the portions where the junction between the fourth region 24 and the fifth region 25 is exposed on the back surface.

Figure 6:
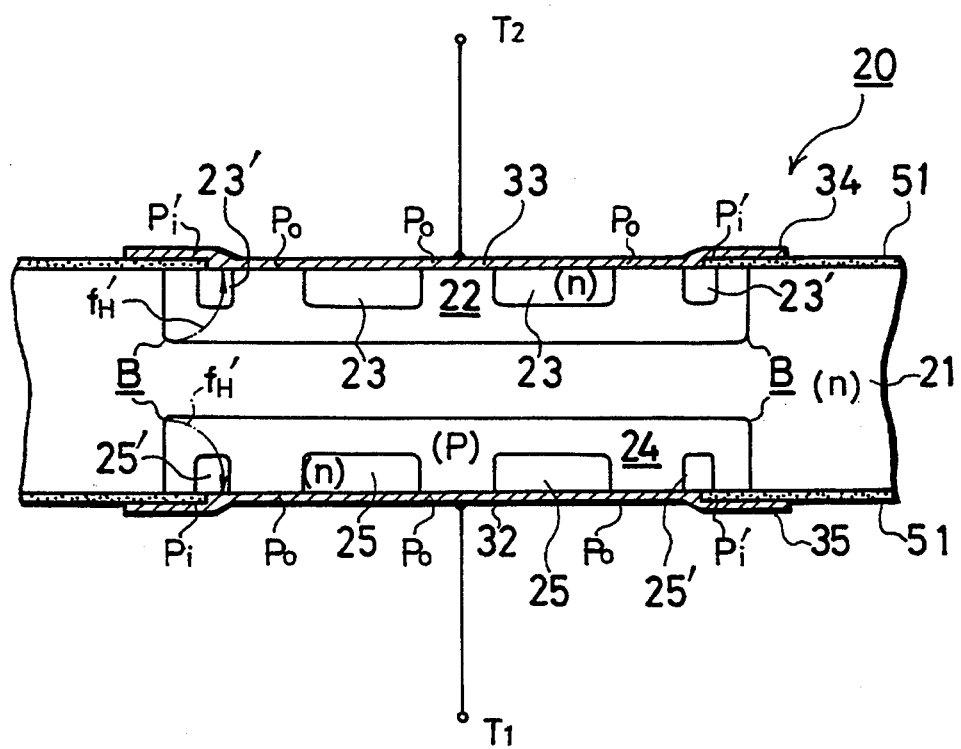
FIG. 6 is a schematic view of still another embodiment of the invention having a modified structure.

FIG. 6 shows another embodiment of the invention. In the case where avalanche breakdown is used as the initial breakdown mechanism in the manner discussed earlier, then if, in FIG. 6 for example, the breakdown should, depending on the polarity of the surge, begin at the corner point B of the first pn junction between the first region 21 and the second region 22 or at the corner point B of the second pn junction between the first region 21 and the fourth region 24, it is possible that the current through this region will not flow along the periphery of the third region 23 sub-regions or the fifth region 25 sub-regions but will pass directly and immediately into the edge portion of the nearer of the ohmic electrodes 33, 32. For avoiding this undesirable concentration of current it is possible to provide auxiliary regions 23', 25'.

The auxiliary regions 23', 25' are of the same conductivity type as the third region 23 and the fifth region 25, the auxiliary regions 23' being in ohmic contact with the ohmic electrode 33 and the auxiliary regions 25' being in ohmic contact with the ohmic electrode 32. Their width is only a fraction (preferably less than one-fourth) of that of the individual third and fifth region sub-regions and the contact portions $P_i$, $P_i$ at the opposite ends of the ohmic electrodes 33, 32 extend only as far as the surface region of these auxiliary regions 23', 25'. With this arrangement, even in a case where the adoption of a point phenomenon such as avalanche breakdown as the initial breakdown mechanism results in a tendency for breakdown to start from the edge or corner portions of the pn junctions (the points indicated as B) notwithstanding a deliberate attempt to achieve breakdown point dispersion by the provision of the high impurity concentration regions 41 . . . in a scattered pattern as indicated schematically in FIG. 5, it becomes possible to avoid allowing the minority carriers to pass directly to the ohmic electrodes via the shortest path as indicated by the phantom arrows $f_H'$ and to establish a desirable length of current path passing around the periphery of the auxiliary regions 23', 25', thereby contributing to more uniform current distribution from the overall point of view.

Contrary to the case of the embodiments described in the foregoing, it is not necessary for the number N ($\geq 1$) of third region sub-regions and the number M ($\geq 1$) of fifth region sub-regions to be the same. Moreover, the sectional dimensions of the third and fifth regions (sub-regions) can be determined independently by separately applying the aforesaid equations for determining magnitudes of their respective constituents. The result of using a different number of third and fifth region sub-regions and/or making the x-direction length $x_E(=x_{E1})$ of the third region sub-regions and the x-direction length $x_E(=x_{E2})$ of the fifth region sub-regions different is that the characteristics of the so-fabricated surge protection device capable of absorbing surges of either polarity will be asymmetrical with respect to surges of opposite polarity. As, however, the demand is generally for electrical characteristics that are symmetrical irrespective of surge polarity, where this is the case it is preferable, as described in the foregoing, to use the same number of third and fifth region sub-regions (N=M) in each of the sections of the surface region extending in one direction, to form the sub-regions in the same dimensions and to dispose them at equal intervals.

While each of the foregoing embodiments relates to only a single surge protection device structure, it is of course possible to fabricate the surge protection device 20 so as to integrate a plurality of such structures into a single first region 21 serving as a common first region for all of the structures. The so-integrated surge protection devices can be connected in parallel for obtaining a surge protection device capable of absorbing large electric currents or, alternately, can be used as a plurality of surge protection devices operating independently on a single substrate. In these cases, device segregation regions (including, for example, mechanically formed grooves) can, if necessary, be formed between the adjacent device structures.

Also effective for achieving greater current flow uniformity in the case where a plurality of third region 23 sub-regions and a plurality of fifth region 25 sub-regions are provided in respective surface regions extending in one direction is to provide the sub-regions of the respective types so that they appear to intersect perpendicularly or obliquely when viewed in plan projection. In these cases, the x-direction $x_1$ with respect to the third region and the x-direction $x_2$ with respect to the fifth region are of course different from each other.

The present invention provides a highly superior breakover type surge protection device capable of absorbing surges of either polarity and, in particular, to provide such a device which prevents undesirable responses in which breakover occurs upon exposure to noise having a small peak value but a very large rate of voltage change with respect to time.

Moreover, certain of the embodiments of the invention enable control of the breakover current and the hold current or enable their values to be stabilized in close accordance with the design specifications. As such, the invention provides new design parameters for controlling and increasing the surge absorption capacity.

The present invention has thus been shown and described with reference to specific embodiments. However, it should be noted that the present invention is in no way limited to the details of the described arrangements but changes and modifications may be made without departing from the scope of the appended claims.

What is claimed is:

1. A vertical type surge protection device for absorbing surges of either polarity, comprising:
    a first semiconductor region of a first conductivity type, having a front principal surface and a back principal surface;
    a second semiconductor region of a second conductivity type opposite to said first conductivity type, forming a first pn junction with the first semiconductor region in the front principal surface;
    a third semiconductor region of said first conductivity type, formed of N number of sub-regions which are arranged side by side at least within a section perpendicular to the front principal surface, the third semiconductor region contacting the side of the second semiconductor region opposite from that in contact with the first semiconductor region and being capable of injecting minority carriers into the second semiconductor region;

a fourth semiconductor region of said second conductivity type, forming a second pn junction with the first semiconductor region in the back principal surface;

a fifth semiconductor region of said first conductivity type, formed of M number of sub-regions which are arranged side by side at least within a section perpendicular to the back principal surface, the fifth semiconductor region contacting the side of the fourth semiconductor region opposite from that in contact with the first semiconductor region and being capable of injecting minority carriers into the fourth semiconductor region;

a first ohmic electrode in electrical contact with surfaces of the fifth semiconductor region sub-regions and with a surface of the fourth semiconductor region at both sides of the fifth semiconductor region sub-regions along a first direction ($x_2$); and a second ohmic electrode in electrical contact with surfaces of the third semiconductor region sub-regions and with a surface of the second semiconductor region at both sides of the third semiconductor region sub-regions along a second direction ($x_1$);

wherein the length $x_{E1}$ of the respective third semiconductor region sub-regions in the second direction ($x_1$) or the length $x_{E2}$ of the respective fifth semiconductor region sub-regions in the first direction ($x_2$) is determined as $$x_{E1} \text{ or } x_{E2} < \sqrt{\frac{8V_f}{\rho_B \cdot C_O \cdot (dV/dt)}}$$

where $\rho_B$ is the sheet resistance of the second semiconductor region at the portion between the first and third semiconductor regions or of the fourth semiconductor region at the portion between the first and fifth semiconductor regions, $V_f$ is the forward bias voltage between the second and third semiconductor regions or between the fourth and fifth semiconductor regions, $C_o$ is the junction capacitance per unit area of the first or second pn junction, and $dV/dt$ is a maximum time derivative of a surge voltage at or below which response is not desired.

2. A surge protection device according to claim 1, wherein the length $x_{E1}$ with respect to the third semiconductor region sub-regions in the second direction or the length $x_{E2}$ with respect to the fifth semiconductor region sub-regions in the first direction satisfies the relationship $$x_{E1} \text{ or } x_{E2} > \sqrt{\frac{8V_f \cdot S_B}{\rho_B \cdot I_{Hmax}}}$$

where $I_{Hmax}$ is the absolute value of the maximum permissible hold current within the range of hold currents capable of maintaining a breakover state irrespective of the polarity of a surge occurring across the first and second ohmic electrodes and $S_B$ is the area of the second semiconductor region or the fourth semiconductor region.

3. A surge protection device according to claim 1, wherein the length $x_{E1}$ with respect to the third semiconductor region sub-regions in the second direction or the length $x_{E2}$ with respect to the fifth semiconductor region sub-regions in the first direction satisfies the relationship $$x_{E1} \text{ or } x_{E2} > \sqrt{\frac{8V_f \cdot S_B}{\rho_B \cdot I_{Hmin}}}$$

where $I_{Hmin}$ is the absolute value of the minimum hold current required for maintaining breakover state irrespective of the polarity of a surge occurring across the first and second ohmic electrodes and $S_B$ is the area of the second semiconductor region or the fourth semiconductor region.

4. A surge protection device according to claim 1, wherein the shapes of the third semiconductor region sub-regions and the fifth semiconductor region sub-regions are substantially rectangular, each having a short-side direction and a long-side direction and the respective length $X_{E1}$ and $x_{E2}$ of the third and fifth semiconductor region sub-regions are their respective lengths in the short side direction.

5. A surge protection device according to claim 1, wherein the first direction ($x_2$) and the second direction ($x_1$) are the same.

6. A surge protection device according to claim 1, wherein the first direction ($x_2$) and the second direction ($x_1$) are perpendicular or oblique relative to each other.

7. A vertical type surge protection device for absorbing surges of either polarity, comprising:

a first semiconductor region of first conductivity type, having a front principal surface and a back principal surface;

a second semiconductor region of second conductivity type opposite to said first conductivity type, forming a first pn junction with the first semiconductor region in the front principal surface;

a third semiconductor region of said first conductivity type, formed of N number of sub-regions which are arranged side by side at least within a section perpendicular to the front principal surface, the third semiconductor region contacting the side of the second semiconductor region opposite from that in contact with the first semiconductor region and being capable of injecting minority carriers into the second semiconductor region;

a fourth semiconductor region of said second conductivity type, forming a second pn junction with the first semiconductor region in the back principal surface;

a fifth semiconductor region of said first conductivity type, formed of M number of sub-regions which are arranged side by side at least within a section perpendicular to the back principal surface, the fifth semiconductor region contacting the side of the fourth semiconductor region opposite from that in contact with the first semiconductor region and being capable of injecting minority carriers into the fourth semiconductor region;

a first ohmic electrode in electrical contact with surfaces of the fifth semiconductor region sub-regions and with a surface of the fourth semiconductor region at both sides of the fifth semiconductor region sub-regions along a first distance ($x_2$); and a second ohmic electrode in electrical contact with surfaces of the third semiconductor region sub-regions and with a surface of the second semiconductor region at both sides of the third semiconductor region sub-regions along a second direction $(x_1)$;

the length $x_{E1}$ of the respective third semiconductor region sub-regions in the second direction $(x_1)$ or the length $x_{E2}$ of the respective fifth semiconductor sub-regions in the first direction $(x_2)$ being determined as $$x_{E1} \text{ or } x_{E2} < \sqrt{\frac{8V_f}{\rho_B \cdot C_O \cdot (dV/dt)}} \cdot \frac{1}{\beta}$$

where $\rho_B$ is the sheet resistance of the second semiconductor region at the portion between the first and third semiconductor regions or of the fourth semiconductor region at the portion between the first and fifth semiconductor region, $V_f$ is the forward bias voltage between the second and third semiconductor regions or between the fourth and fifth semiconductor regions, $C_o$ is the junction capacitance per unit area of the first or second pn junction, $\beta$ is the proportion of the minority carriers injected from the fourth semiconductor region that reach the second semiconductor region or the proportion of the minority carriers injected from the second semiconductor region that reach the fourth semiconductor region, and dV/dt is a maximum time derivative of a surge voltage at or below which response is not desired.

8. A vertical type surge protection device for absorbing surges of either polarity, comprising:

a first semiconductor region of first conductivity type, having a front principal surface and a back principal surface;

a second semiconductor region of second conductivity type opposite to said first conductivity type, forming a first pn junction with the first semiconductor region in the front principal surface;

a third semiconductor region of said first conductivity type, formed of N number of substantially circular sub-regions, the third semiconductor region contacting the side of the second semiconductor region opposite from that in contact with the first semiconductor region, and capable of injecting minority carries into the second semiconductor region;

a fourth semiconductor region of said second conductivity type, forming a second pn junction with the first semiconductor region in the back principal surface;

a fifth semiconductor region of said first conductivity type, formed of M number of substantially circular sub-regions, the fifth semiconductor region contacting the side of the fourth semiconductor region opposite from that in contact with the first semiconductor region, and capable of injecting minority carriers into the fourth semiconductor region;

a first ohmic electrode in electrical contact with a surface of the fourth semiconductor region and with surfaces of the substantially circular fifth semiconductor region sub-regions along all or most of their circumferences; and a second ohmic electrode in electrical contact with a surface of the second semiconductor region and with surfaces of the substantially circular third semiconductor region sub-regions along all or most of their circumferences;

the diameter of $X_{E1}$ of the respective third semiconductor region sub-regions or the diameter $x_{E2}$ of the respective fifth semiconductor region sub-regions being determined as $$x_{E1} \text{ or } x_{E2} < \sqrt{\frac{16V_f}{\rho_B \cdot C_o \cdot (dV/dt)}}$$

where $\rho_B$ is the sheet resistance of the second semiconductor region at the portion between the first and third semiconductor regions or of the fourth semiconductor region at the portion between the first and fifth semiconductor regions, $V_f$ is the forward bias voltage between the second and third semiconductor regions or between the fourth and fifth semiconductor regions, $C_o$ is the junction capacitance per unit area of the first or second pn junction, and dV/dt is a maximum time derivative of a surge voltage at or below which response is not desired.

9. A surge protection device according to claim 8, wherein the diameter of $X_{E1}$ with respect to the third semiconductor region sub-regions or the diameter $x_{E2}$ with respect to the fifth semiconductor region sub-regions satisfies the relationship $$x_{E1} \text{ or } x_{E2} < \sqrt{\frac{16V_f \cdot S_B}{\rho_B \cdot I_{Hmax}}}$$

where $I_{max}$ is the absolute value of the maximum permissible hold current in order to maintain a breakover state irrespective of the polarity of a surge occurring across the first and second ohmic electrodes and $S_B$ is the area of the second semiconductor region or the fourth semiconductor region.

10. A surge protection device according to claim 8, wherein the diameter $X_{E1}$ with respect to the third semiconductor region sub-regions or the diameter $x_{E2}$ with respect to the fifth semiconductor region sub-regions satisfies the relationship $$x_{E1} \text{ or } x_{E2} < \sqrt{\frac{16V_f \cdot S_B}{\rho_B \cdot I_{Hmin}}}$$

where $I_{Hmin}$ is the absolute value of the minimum hold current required for maintaining a breakover state irrespective of the polarity of a surge occurring across the first and second ohmic electrodes and $S_B$ is the area of the second semiconductor region or the fourth semiconductor region.

11. A vertical type surge protection device for absorbing surges of either polarity, comprising:

a first semiconductor region of first conductivity type, having a front principal surface and a back principal surface;

a second semiconductor region of second conductivity type opposite to said first conductivity type, forming a first pn junction with the first semiconductor region in the front principal surface;

a third semiconductor region of said first conductivity type, formed of N number of substantially circular sub-regions the third semiconductor region contacting the side of the second semiconductor region opposite from that in contact with the first semiconductor region, and capable of injecting minority carriers into the second semiconductor region;

a fourth semiconductor region of said second conductivity type, forming a second pn junction with the first semiconductor region in the back principal surface;

a fifth semiconductor region of said first conductivity type, formed of M number of substantially circular sub-regions, the fifth semiconductor region contacting the side of the fourth semiconductor region opposite that in contact with the first semiconductor region, and capable of injecting minority carriers into the fourth semiconductor region;

a first ohmic electrode in electrical contact with a surface of the fourth semiconductor region and with surfaces of the substantially circular fifth semiconductor region sub-regions along all or most of their circumferences; and a second ohmic electrode in electrical contact with a surface of the second semiconductor region and with surfaces of the substantially circular third semiconductor region sub-regions along all or most of their circumferences;

the diameter $x_{E1}$ of the respective third semiconductor region sub-regions or the diameter $x_{E2}$ of the respective fifth semiconductor region sub-regions being determined as $$x_{E1} \text{ or } x_{E2} < \sqrt{\frac{16 V_f}{\rho_B \cdot C_o \cdot (dV/dt)} \cdot \frac{1}{\beta}}$$

where $\rho_B$ is the sheet resistance of the second semiconductor region at the portion between the first and third semiconductor regions or of the fourth semiconductor region at the portion between the first and fifth semiconductor regions, $V_f$ is the forward bias voltage between the third and second semiconductor regions or between the fifth and fourth semiconductor regions, $C_o$ is the junction capacitance per unit area of the first or second pn junction, $\beta$ is the proportion of the minority carriers injected from the fourth semiconductor region that reach the second semiconductor region or the proportion of the minority carriers injected from the second semiconductor region that reach the fourth semiconductor region, and dV/dt is a maximum time derivative of a surge voltage at or below which response is not desired.

* * * * *

UNITED STATES PATENT AND TRADEMARK OFFICE
CERTIFICATE OF CORRECTION

PATENT NO. : 5,371,385
DATED : December 6, 1994
INVENTOR(S) : Yutaka HAYASHI, et al.

It is certified that error appears in the above-indentified patent and that said Letters Patent is hereby corrected as shown below:

On the title page, Item [54], and Column 1, Line 2, the title is listed incorrectly. It should read:

--VERTICAL TYPE SURGE PROTECTION DEVICE FOR ABSORBING SURGES OF EITHER POLARITY--

Signed and Sealed this

Eighteenth Day of April, 1995

*Attest:*

BRUCE LEHMAN

*Commissioner of Patents and Trademarks*

*Attesting Officer*